(12) United States Patent
Tanaka

(10) Patent No.: US 6,480,997 B1
(45) Date of Patent: Nov. 12, 2002

(54) AUTOMATIC PLACEMENT AND ROUTING DEVICE AND METHOD OF AUTOMATIC PLACEMENT AND ROUTING

(75) Inventor: Genichi Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 122 days.

(21) Appl. No.: 09/670,573

(22) Filed: Sep. 27, 2000

(30) Foreign Application Priority Data

Apr. 4, 2000 (JP) ........................................ 2000-102482

(51) Int. Cl.$^7$ .............................................. G06F 17/50
(52) U.S. Cl. ............................. 716/12; 716/13; 716/14
(58) Field of Search ........................................ 716/1–14

(56) References Cited

U.S. PATENT DOCUMENTS

| | | | | |
|---|---|---|---|---|
| 4,613,941 A | * | 9/1986 | Smith et al. | 716/12 |
| 4,615,011 A | * | 9/1986 | Linsker | 716/13 |
| 5,485,396 A | * | 1/1996 | Brasen et al. | 716/9 |
| 5,623,420 A | * | 4/1997 | Yee et al. | 716/1 |
| 5,801,959 A | * | 9/1998 | Ding et al. | 716/11 |

FOREIGN PATENT DOCUMENTS

| | | |
|---|---|---|
| JP | 5-326836 | 12/1993 |
| JP | 10-134099 | 5/1998 |

* cited by examiner

Primary Examiner—Vuthe Siek
Assistant Examiner—Sun James Lin
(74) Attorney, Agent, or Firm—Burns, Doane, Swecker & Mathis, LLP

(57) ABSTRACT

An automatic placement and routing device comprises a standard-net connection regulator for regulating the connecting relations between standard nets and cells into a net list, a cell placement means for arranging the placement of cells on the basis of the connecting relations of the standard nets, and a variable-net connection regulator for regulating the connecting relations between variable nets and cells whose placement has already been completed by the cell placement means. Since, by this configuration, the connecting relations of the standard nets are regulated before the placement of cells, and the connecting relations of the variable nets are regulated after the placement of cells on the basis of the result of the placement, such effects as that the particular wiring is made short, and that the complexity of wiring is made small and so on can be obtained.

6 Claims, 19 Drawing Sheets

AUTOMATIC PLACEMENT AND ROUTING DEVICE AND METHOD OF AUTOMATIC PLACEMENT AND ROUTING

BACKGROUND OF THE INVENTION

1. Field of the Invention

The present invention relates to an automatic placement and routing device for automatically arranging the positions of a plurality of cells and wiring those cells by use of a plurality of nets so as to form a semiconductor integrated circuit (hereinafter may be referred to as a semiconductor IC circuit or Just as a semiconductor IC), and also relates to a method of automatic placement and routing in relation to this device.

2. Description of the Related Art

FIG. 27 is a block diagram showing the configuration of a conventional automatic placement and routing device. In the figure, reference numeral 101 denotes an all-net connection regulator for regulating all the connecting relations between nets and cells into a net list, numeral 102 denotes a cell placement means for arranging the position of cells on the basis of the all-net connecting relations, numeral 103 denotes a global routing means for carrying out a global routing operation with respect to the cells after the placement thereof in accordance with the all-net connecting relations, and numeral 104 denotes a detail routing means for carrying out a detail routing operation with respect to the thus located cells on the basis of the result of the global routing conducted in accordance with the all-net connecting relations.

The operation of the conventional automatic placement and routing device is now explained as below.

FIG. 28 denotes a flow chart showing the conventional method of automatic placement and routing. In the figure, it is shown that first in step ST101, all the relations between nets and cells is regulated into a net list by the all-net connection regulator 101, and thereafter in step ST102, the placement of cells is carried out on the basis of the all-net connecting relations.

Thereafter, in step ST103, a global routing of the thus located cells is performed in accordance with the all-net connecting relations, and then in step ST104, a detail routing of the located cells is performed, again in accordance with the all-net connecting relations.

FIG. 29 is a layout showing the state immediately after the completion of step ST104 of FIG. 28. In the figure, numerals 111 to 114 denote standard cells which are regulated to connect to standard nets, numerals 115 and 116 denote particular cells which are regulated to connect only to variable nets, numeral 117 denotes a pin in the standard cell 111, 118 denotes a pin in the standard cell 112, 119 denotes a pin in the standard cell 113, 1120 denotes a pin in the standard cell 114, numeral 121 and 122 denote pins both in the standard cell 115, numeral 123 and 124 denote pins in the standard cell 116, numeral 125 denotes a wiring physically showing the standard net regulated to connect pins 117 and 118, numeral 126 denotes a wiring physically showing the standard net regulated to connect pins 119 and 120, numeral 127 denotes a wiring physically showing the variable net regulated to connect pins 118 and 124, and numeral 128 denotes a wiring physically showing the variable net regulated to connect pins 119 and 121. The wiring that physically shows the standard net is referred to as a standard wiring, whereas the wiring that physically shows the variable net is referred to as a particular wiring hereinafter. Note that the variable net here means a net whose connecting relation dose not need to be regulated in advance, namely a net which can be freely connected to any one of a plurality of instances of a same master, for example -a net connected to a test pad. On the other hand, the standard net here means a net other than these variable nets.

After all these processes above, a mask is formed on the basis of the thus obtained result of the automatic placement and routing, and a semiconductor IC circuit is formed by used of the thus provided mask. As mentioned above, in the conventional automatic placement and routing device and also the method of placement and routing, the all-net connecting relations are regulated before the placement of cells, and all the cells are disposed at one time. In other words, neither distinction between the variable nets and the standard nets, nor distinction between the particular cells and the standard cells is carried out, and due to this, there have been such problems that the particular wiring physically showing the variable net s made exceptionally long, the complexity of wiring of a semiconductor IC circuit formed by physically showing the standard nets and variable nets is made large, and that the standard wiring receives adverse effects from the particular wiring in terms of signal delay, power consumption, signal integrity and so on.

For example, in FIG. 29, the particular wiring 127 can be made shorter by connecting it to the pin 124. Further, if the cell to be connected is optimized itself and connected to the pin 121 of the particular cell 115, it can be made further shorter.

SUMMARY OF THE INVENTION

The present invention has been proposed to solve the problems aforementioned, and it is an object of the present invention to provide an automatic placement and routing device for use in forming a semiconductor integrated circuit, in which the particular wiring is made short, and the complexity of wiring is made small, and also the standard wiring is not likely to receive adverse effects from the particular wiring, and it is also another object of the present invention to obtain a method of automatic placement and routing by use of this device.

An automatic placement and routing device provided for accomplishing the first object of the present invention according to a first aspect thereof is constructed in such a manner that it comprises a standard-net connection regulating means for regulating the connecting relations between the standard nets and the cells into a net list, a cell placement means for arranging the placement of cells on the basis of the connecting relations of the standard nets, and a variable-net connection regulating means for regulating into a net list the connecting relations between the variable nets and the cells whose placement has already been completed.

In the automatic placement and routing device as constructed above, the variable-net connection regulating means regulates the connecting relations between the variable nets and cells on the basis of the result of the cell placement conducted by said cell placement means.

The automatic placement and routing device according to another aspect further comprises a global routing means for executing a global routing with respect to the cells whose placement has already been completed, in accordance with the connecting relations of the standard nets, wherein said variable-net connection regulating means regulates the connecting relation between the variable nets and cells on the basis of the result of the global routing conducted in accordance with the connecting relations of the standard nets.

The automatic placement and routing device according to another aspect further comprises a global routing means for executing a global routing with respect to the cells whose placement has already been completed, in accordance with the connecting relations of the standard nets, and a detail routing means for executing a detail routing with respect to the cells already located, on the basis of the global routing conducted in accordance with the connecting relations of the standard nets, wherein the variable net connection regulating means regulates the connecting relations between the variable nets and the cells on the basis of the result of the detail routing.

The automatic placement and routing device according to another aspect further comprises a global routing means for executing a global routing with respect to the cells whose placement has already been completed, in accordance with the connecting relations of the standard nets and those of the variable nets, and a connection improving means for improving the connecting relations of the variable nets on the basis of the result of the global routing conducted in accordance with the connecting relations of the standard nets and those of the variable nets.

The automatic placement and routing device according to another aspect further comprises a global routing means for executing a global routing with respect to the cells whose placement has already been completed, in accordance with the connecting relations of the standard nets and those of the variable nets, a detail routing means for executing a detail routing with respect to the cells already located, on the basis of the result of the global routing conducted in accordance with the connecting relations of the standard nets and those of the variable nets, and a connection improving means for improving the connecting relations of the variable nets on the basis of the result of the detail routing.

The automatic placement and routing device according to further aspect further comprises a detail routing means for executing a detail routing with respect to the cells whose placement has already been completed, on the basis of the result of the global routing conducted in accordance with the connecting relations of the standard nets and those of the variable nets, and a connection improving means for improving the connecting relations of the variable nets on the basis of the result of the detail routing.

The automatic placement and routing device according to still further comprises a standard-cell placement means for arranging the placement of the standard cells, on the basis of the connecting relations of the standard nets, and a particular cell placement means for arranging the placement of the particular cells outside the area in which the standard cells are disposed.

The automatic placement and routing device according to still further aspect further comprises a global routing means for executing a global routing with respect to the cells whose placement has already been completed, in accordance with the connecting relations of the standard nets, and the particular-cell placement means disposes the particular cells on the basis of the result of the global routing.

A method of automatic placement and routing provided for accomplishing the second object of the present invention comprises a standard-net connection regulating step for regulating the connecting relations between the standard nets and cells into a net list, a cell placement step for arranging the placement of cells on the basis of the connecting relations of the standard nets, and a variable-net connection regulating step for regulating the connecting relations between the variable nets and the cells whose placement has already been completed by said cell placement means.

The method of automatic placement and routing further comprises other steps for executing the operations in connection with each of the members configuring the above-explained automatic placement and routing device.

PRECISE DESCRIPTION OF THE PREFERRED EMBODIMENTS

Several embodiments of the present invention are now explained below.

First Embodiment

Figure 1:
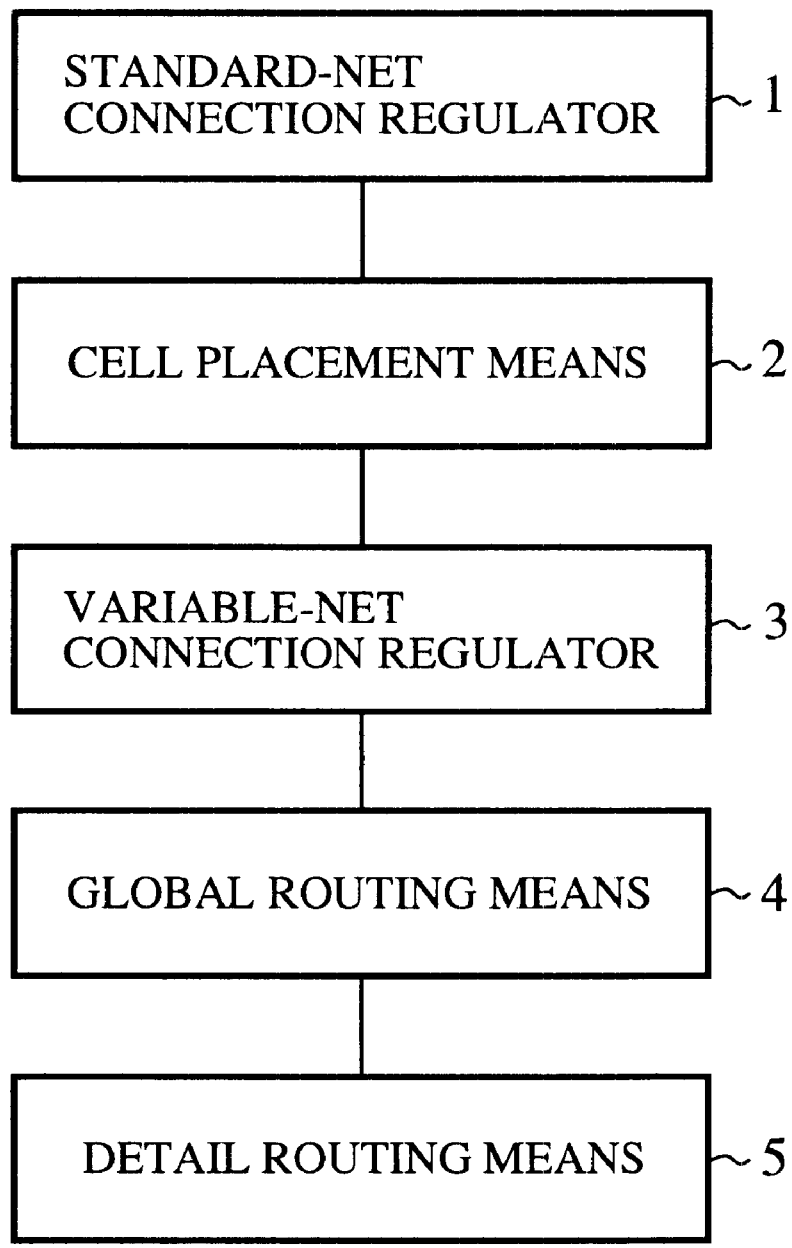
FIG. 1 is a schematic diagram showing an automatid placement and routing device according to a first embodiment of the present invention.

FIG. 1 is a schematic diagram showing an automatic placement and routing device according to a first embodiment of the present invention. In the figure, numeral 1 denotes a standard-net connection regulator for regulating the connecting relations between standard nets and cells into a net list, numeral 2 denotes a cell placement means for arranging the placement of cells on the basis of the connecting relations of the standard nets, numeral 3 denotes a variable-net connection regulator for regulating the connecting relations between variable nets and cells into a net list, numeral 4 denotes a global routing means for carrying out a global routing operation with respect to the thus located cells in accordance with the connecting relations of the standard nets and those of the variable nets, and numeral 5 denotes a detail routing means for carrying out a detail routing with respect to the already located cells on the basis of the result of the global routing conducted in accordance with the connecting relations of the standard nets and those of variable nets.

The operation of the automatic placement and routing device according to this embodiment is now explained as below.

Figure 2:
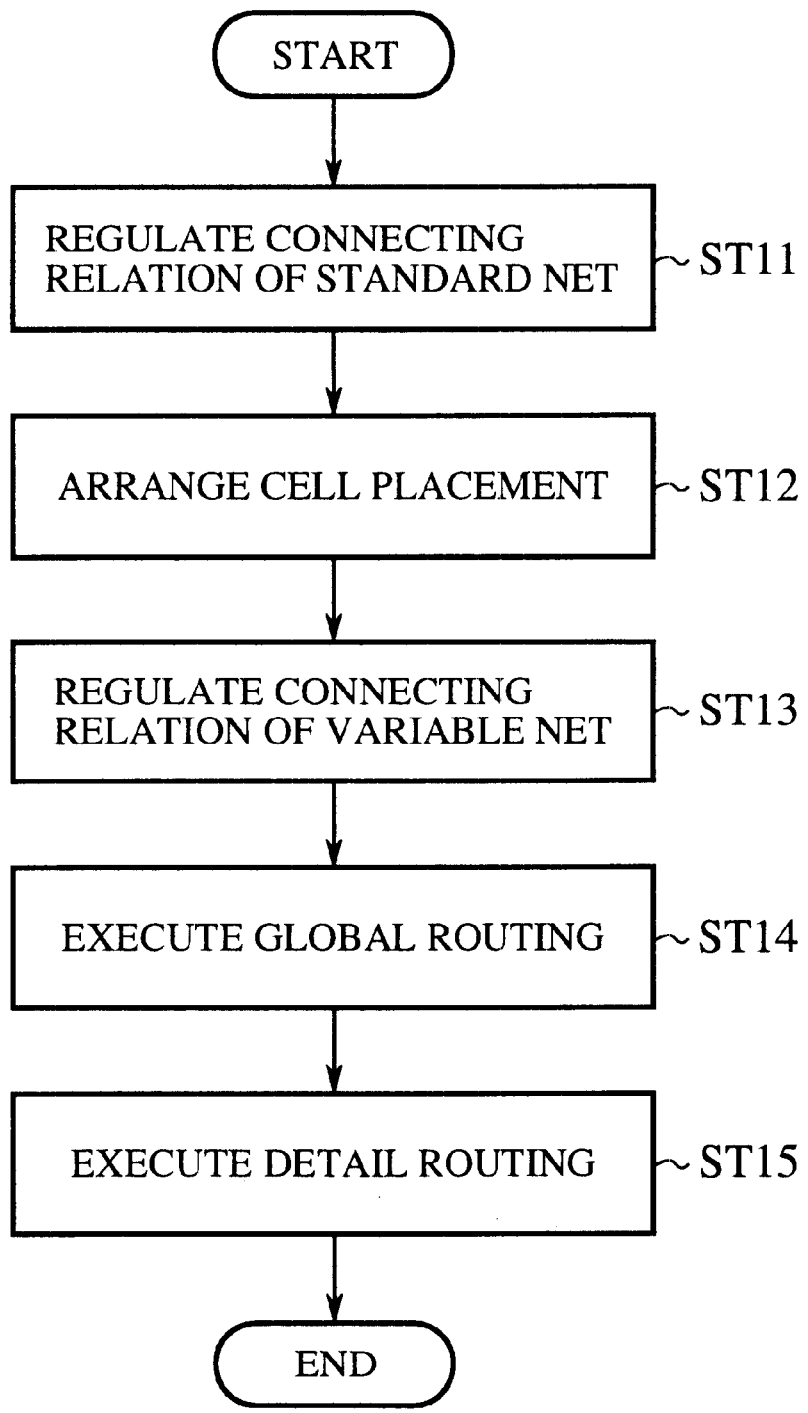
FIG. 2 is a flowchart showing a method of automatic placement and routing according to the first embodiment of the present invention.

FIG. 2 is a flowchart showing a method of automatic placement and routing according to the first embodiment of the present invention.

First, the connecting relations between standard nets and cells are regulated by the standard connection regulator 1 in step ST11. In this step ST11, the connecting relations between variable nets and cells are not regulated. Thereafter, arrangement of the placement of cells is conducted on the basis of the connecting relations of the standard nets by the cell placement means 2 in step ST12.

Figure 3:
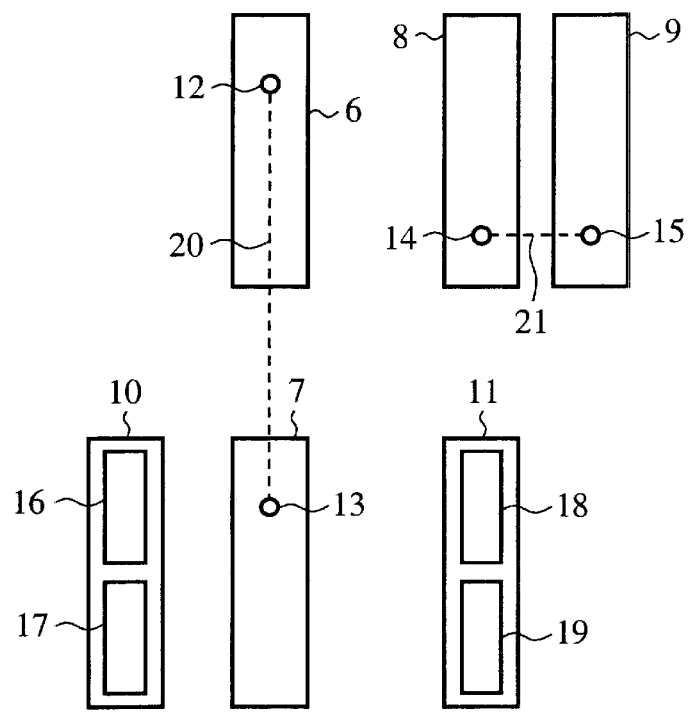
FIG. 3 is a layout showing the state immediately after the step ST12 of FIG. 2.

FIG. 3 is a layout showing the state immediately after the completion of step ST12 of FIG. 2. In the figure, numerals 6 to 9 denote standard cells which are regulated to connect to standard nets, numerals 10 and 11 denote particular cells regulated to connect only to variable nets, numeral 12 denotes a pin in the standard cell 6, 13 denotes a pin in the standard cell 7, 14 denotes a pin in the standard cell 8, 15 denotes a pin in the standard cell 9, numerals 16 and 17 denote pins in the particular cell 10, and numerals 18 and 19 denote pins in the particular cells 11. In FIG. 3, in order to indicate that the pins 12 and 13 are regulated to be connected to each other by way of a standard net, the connecting relation thereof is represented by a broken line having a reference numeral 20. Note that other pins (not shown) may be provided in each of the standard cells 6 to 9 and also in each of the particular cells 10 and 11.

Thereafter, on the basis of the result of the placement of cells, the connecting relations between variable nets and cells are regulated in step ST13 by the variable-net connection regulator 3. When regulating the connecting relations of the variable nets, a weighted evaluating function is used. The weighted evaluating function takes parameters such as; the length of the particular wiring by which the variable net is physically represented, the complexity of wiring of a semiconductor IC circuit formed when standard nets and variable nets are physically represented, and also as the delay time of a signal propagated through the standard wiring by which the standard wiring is physically represented. Apart from these parameters, the amount of power consumption by use of the standard wiring, by which the standard net is physically represented, and also a signal integrity of a signal propagated through the standard wiring, by which the standard net is physically represented can also be taken as parameters. For example, when regulating the connecting relations between variable nets and cells in such a manner as to shorten the particular wiring, an evaluating function to be adopted here should be the one whose weight coefficient with respect to the length of the particular wiring is large.

Figure 4:
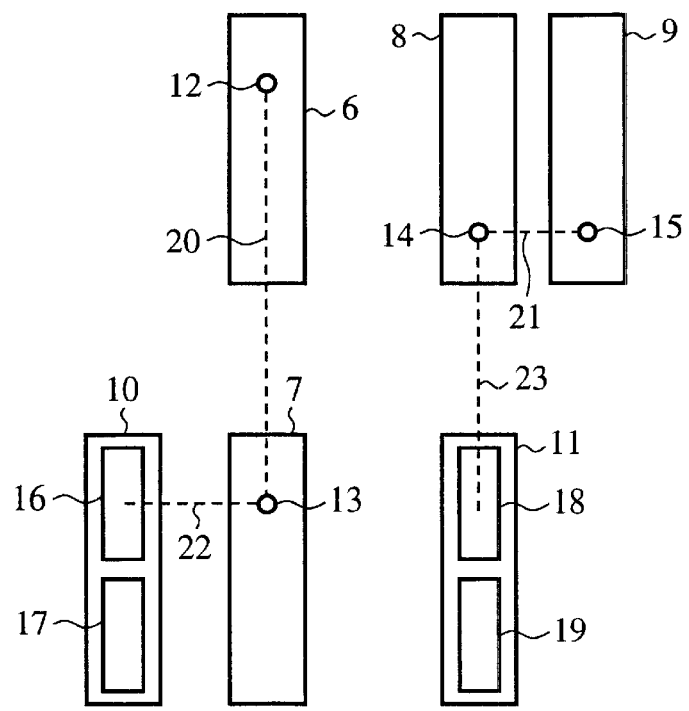
FIG. 4 is a layout showing the state immediately after the step ST13 of FIG. 2.

FIG. 4 is a layout showing the state immediately after the step ST13 of FIG. 2. FIG. 4 shows the case in which the connecting relations of the variable nets are regulated such that the particular wiring is made short. In the figure, in order to indicate that the pins 13 and 16 are regulated to be connected to each other by way of a variable net, the connecting relation thereof is indicated by a numeral 22, whereas in order to indicate that the pins 14 and 18 are regulated to be connected to each other by way of a variable net, the connecting relation thereof is indicated by a numeral 23. Since other elements are same as or similar to those having the same numerals shown in FIG. 3, the detailed explanation thereabout is omitted here. In this case, the standard net whose connecting relation is represented by the numeral 20 is regulated to connect to the pin 16 by way of a variable net, whereas the standard net whose connecting relation is represented by the numeral 21 is regulated to connect to the pin 18 by way of a variable net.

Thereafter, a global routing is executed with respect to the cells after the placement thereof by the global routing means 4 in step ST14 in accordance with the connecting relations of the variable nets and those of the standard nets. The global routing is a step in which the whole wiring area is divided into a plurality of small areas in accordance with the wiring configuration, and roughly drawn paths of each of the nets are applied to each of the thus divided areas.

Thereafter, a detail routing is carried out with respect to the cells whose placement has already been completed by the detail routing means 5 in step ST15, on the basis of the result of the global routing conducted in accordance with the connecting relations of the variable nets and those of the standard nets. The detail routing is a step in which the final wiring operation is executed to each of the areas on the basis of the above-mentioned roughly drawn paths.

After this step, a mask is formed on the basis of the result of the above-mentioned automatic placement and routing and a semiconductor integrated circuit is formed by use of the thus formed mask.

As explained heretofore, according to the first embodiment of the present invention, since the connecting relations of the standard nets are regulated before the placement of cells, and the connecting relations of the variable nets are regulated after the placement thereof on the basis of the result of the placement of cells, such effects as that the particular wiring is made short, and that the complexity of wiring is made small and so on are obtained.

Further, since the connecting relations of the variable nets can be regulated in such a manner that the standard wiring does not receive any adverse effect from the particular wiring, a semiconductor IC circuit of high speed, low power consumption and of high reliability can be obtained.

Second Embodiment

Figure 5:
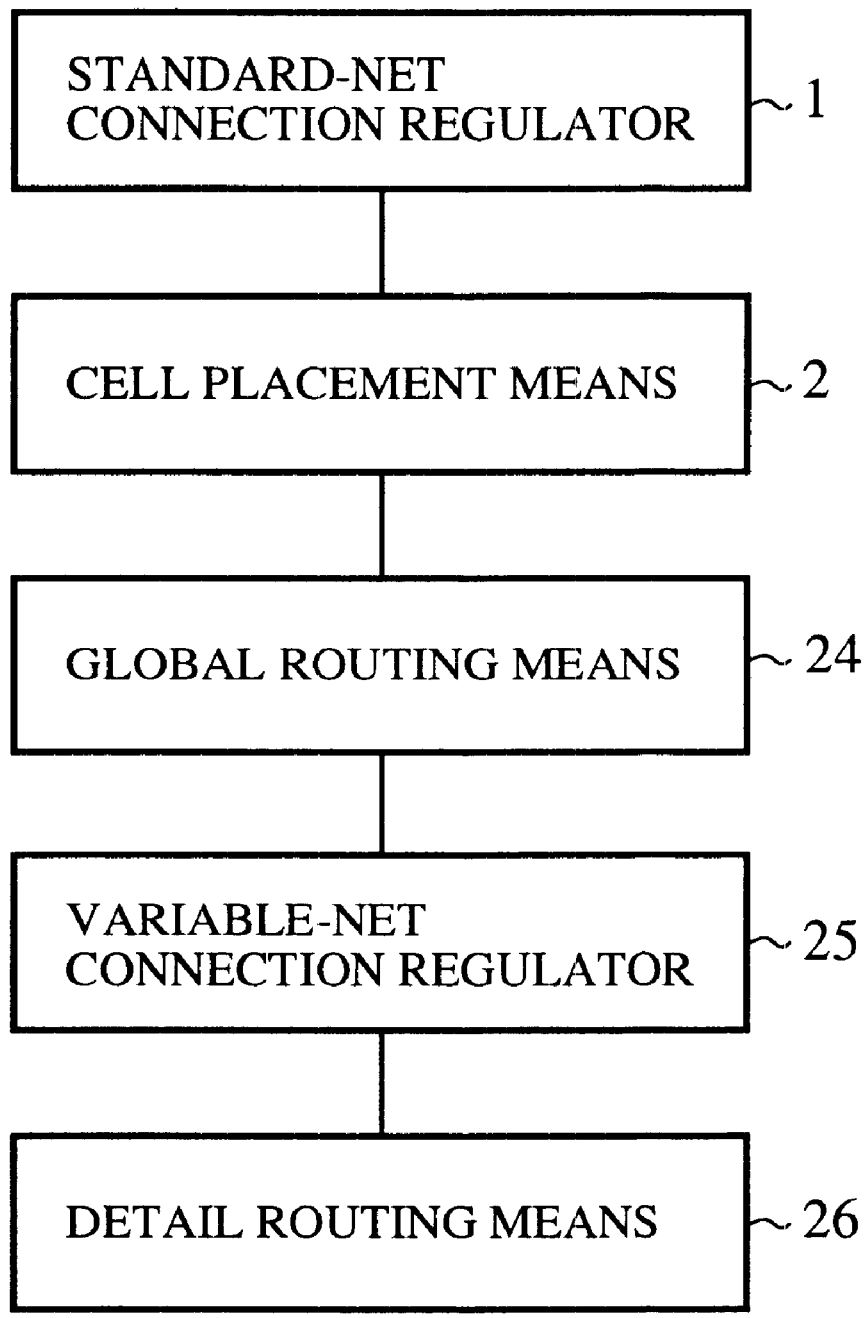
FIG. 5 is a block diagram showing the automatic placement and routing device according to a second embodiment of the present invention.

FIG. 5 is a block diagram showing an automatic placement and routing device according to a second embodiment of the present invention. In the figure, numeral 24 denotes a global routing means for executing a global routing with respect to the cells whose placement has already been completed, numeral 25 denotes; a variable-net connection regulator for regulating the connecting relations between variable nets and cells into a net list on the basis of the result of the global routing conducted in accordance with the connecting relations of the standard nets, and also for executing a global routing with respect to those located cells in accordance with the connecting relations of the variable nets, and numeral 26 denotes a detail routing means for executing a detail routing with respect to the cells already located on the basis of the result of the global routing conducted in accordance with the connecting relations of the standard nets and those of the variable nets. Since other elements are same as or similar to those having the same numerals shown in FIG. 1, the detailed explanation thereabout is omitted here.

Figure 6:
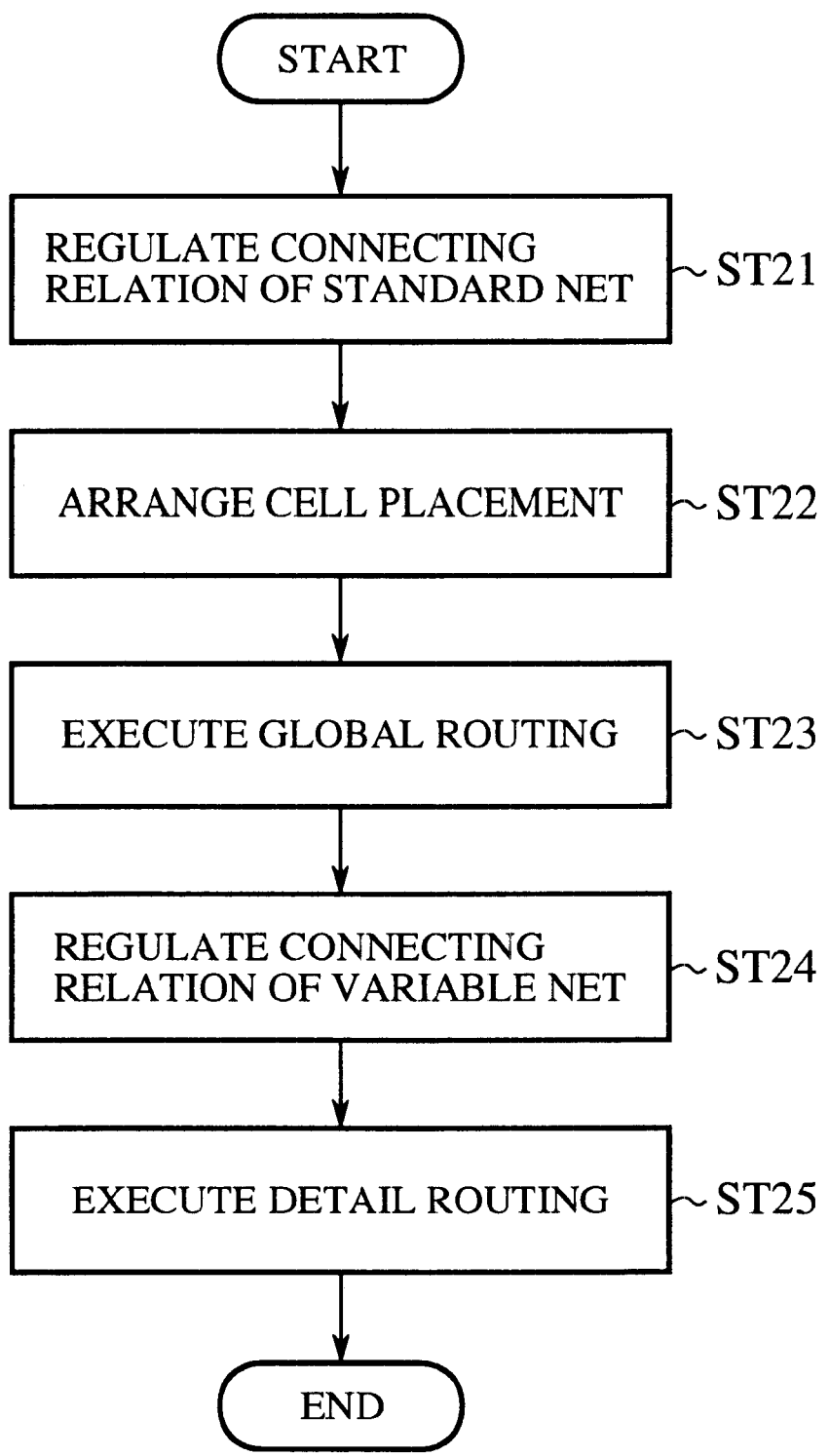
FIG. 6 is a flowchart showing a method of automatic placement and routing according to the second embodiment of the present invention.

The operation of the automatic placement and routing device according to this embodiment is now explained as below FIG. 6 is a flowchart showing a method of automatic placement and routing according to the second embodiment of the present invention.

First, just like the first embodiment, the connecting relation between standard nets and cells are regulated by the standard connection regulator 1 in step ST21. Thereafter, the placement of cells is executed on the basis of the connecting relations of the standard nets by the cell placement means 2 in step ST22. Note that the layout showing the state immediately after the step ST22 is same as that of FIG. 3.

Thereafter, in accordance with the connecting relations of the standard nets, a global routing is carried out with respect to the cells after the placement thereof is already completed in step ST23.

Figure 7:
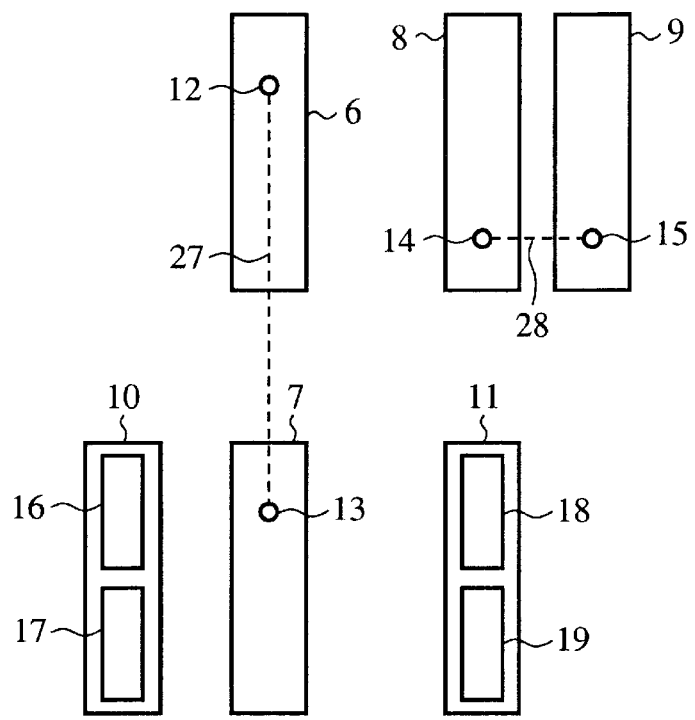
FIG. 7 is a layout showing the state immediately after the step ST23 of FIG. 6.

FIG. 7 is a layout showing the state immediately after the completion of the step ST23 of FIG. 6. In the figure, the path, to which the standard net regulated to connect the pins 12 and 13 is applied, is indicated by a broken line 27, whereas the path, to which standard net regulated to connect the pins 14 and 15 is applied, is indicated by a broken line 28. Since other elements are same as or similar to those having the same numerals shown in FIG. 3, the detailed explanation thereabout is omitted here.

Thereafter, on the basis of the result of the global routing conducted in accordance with the connecting relations of the standard nets, the connecting relations between variable nets and cells are regulated into the net list in step ST24. When regulating the connecting relations of the variable nets, a weighted evaluating function is used. In step ST24, a global routing with respect to the cells whose placement has already been completed, in accordance with the connecting relation of the variable nets.

Figure 8:
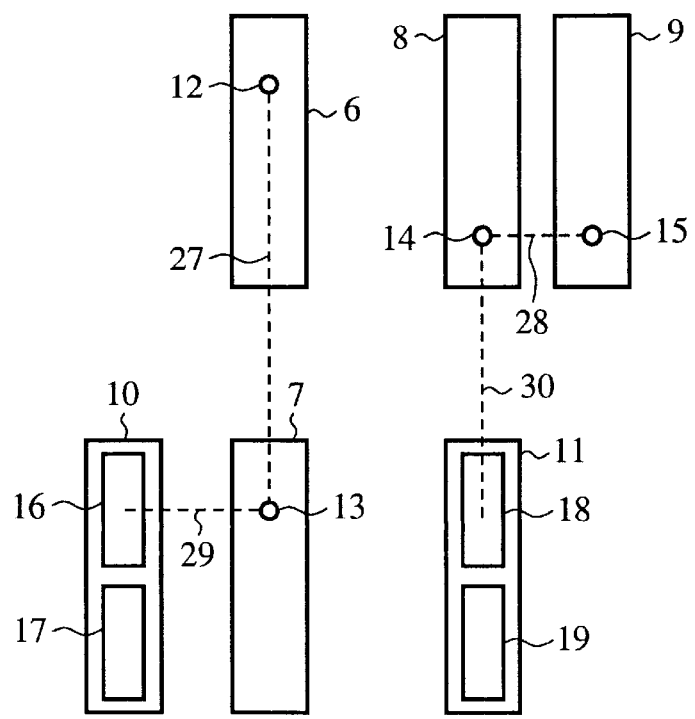
FIG. 8 is a layout showing the state immediately after the step ST24 of FIG. 6.

FIG. 8 is a layout showing the state immediately after the completion of the step ST24 of FIG. 6. FIG. 8 shows the case in which the connecting relations of the variable nets are regulated such that the particular wiring is made short. In the figure, the path, to which the variable net regulated to connect the pins 13 and 16 is applied, is indicated by a broken line 29, whereas the path, to which the variable net regulated to connect the pins 14 and 18 is applied is indicated by a broken line 30. In this case, the path to which the standard net had been regulated to connect the pins 12 and 13 is further regulated to be connected to the pin 16 by way of a variable net, whereas the path to which the standard net had been regulated to connect the pins 14 and 15 is further regulated to be connected to the pin 18 by way of a variable net. Since other elements are same as or similar to those having the same numerals shown in FIG. 7, the detailed explanation thereabout is omitted here.

Thereafter, on the basis of the result of the global routing conducted in accordance with the connecting relations of the standard nets and those of the variable nets, a detail routing with respect to the cells after the placement thereof is executed in step ST25 by the detail routing means 26.

After this step, a mask is formed on the basis of the result of the above-mentioned automatic placement and routing and a semiconductor integrated circuit is formed by use of the thus formed mask.

As explained heretofore, according to the second embodiment of the present invention, the connecting relations of the standard nets are regulated before the placement of cells, and after the placement of cells, a global routing is executed with respect to the thus located cells and the connecting relations of the variable nets are regulated on the basis of the result of the global routing, so that such effects as those obtained by the first embodiment can be obtained.

Third Embodiment

Figure 9:
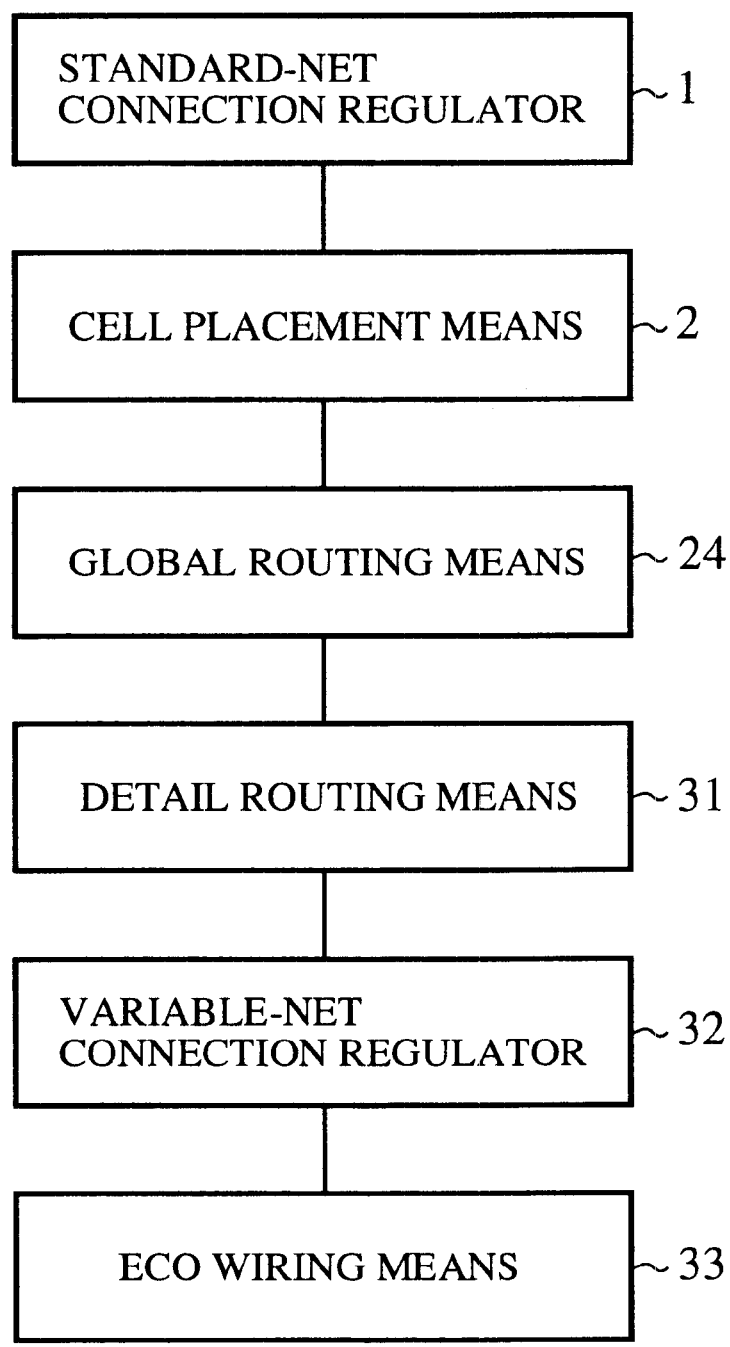
FIG. 9 is a block diagram showing the automatic placement and routing device according to a third embodiment of the present invention.

FIG. 9 is a block diagram showing an automatic placement and routing device according to a third embodiment of the present invention. In the figure, numeral 31 denotes a detail routing means for executing a detail routing with respect to the cells after the placement thereof on the basis of the global routing conducted in accordance with the connecting relations of the standard nets, numeral 32 denotes a variable-net connection regulator for regulating the connecting relations between variable nets and cells into the net list on the basis of the result of the detail routing, and numeral 33 denotes an Engineering Change Order wiring means (hereinafter referred to just as "ECO wiring means") for amending the wiring executed with respect to the cells after the detail routing, in accordance with the connecting relations of the variable nets. Since other elements are same as or similar to those having the same numerals shown in FIG. 5, the detailed explanation thereabout is omitted here.

The operation of the automatic placement and routing device according to this embodiment is now explained as below,.

Figure 10:
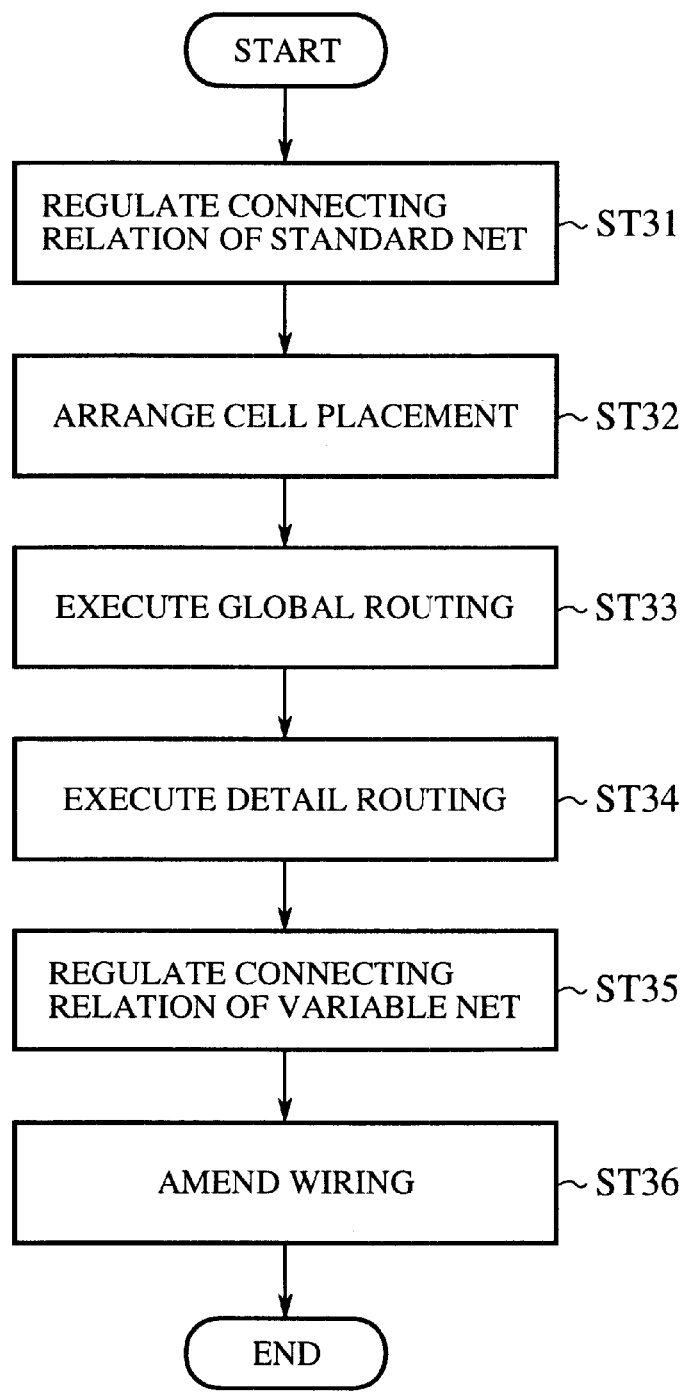
FIG. 10 is a flowchart showing a method of automatic placement and routing according to the third embodiment of the present invention.

FIG. 10 is a flowchart showing a method of automatic placement and routing according to the third embodiment of the present invention.

First, just like the first embodiment, the connecting relations between standard nets and cells are regulated into a net list by the standard connection regulator 1 in step ST31. Thereafter, the placement of cells is executed on the basis of the connecting relations of the standard nets by the cell placement means 2 in step ST32. Note that the layout showing the state immediately after the step ST32 is same as that of FIG. 3.

Thereafter, just like the case of the second embodiment, a global routing is carried out in step ST33 with respect to the cells whose placement has already been completed, in accordance with the connecting relations of the standard nets by the global routing means 24. Note that the layout showing the state immediately after the step ST33 is same as that of FIG. 7.

After these operations, a detail routing is carried out with respect to the cells already located on the basis of the global routing conducted in accordance with the connecting relations of the standard nets by the detail routing means 31.

Figure 11:
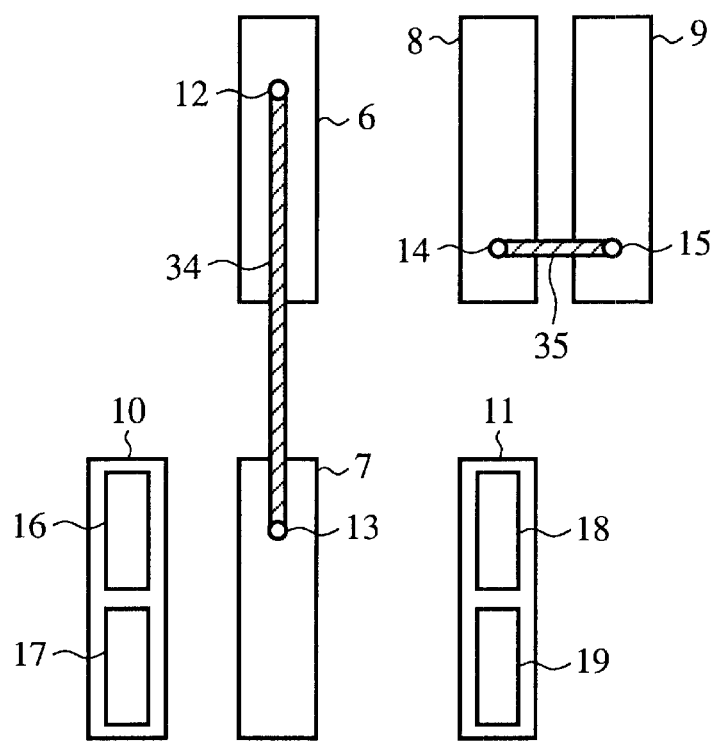
FIG. 11 is a layout showing the state immediately after the step ST34 of FIG. 10.

FIG. 11 is a layout showing the state immediately after the completion of step ST34 of FIG. 10. In the figure, numeral 34 denotes a standard wiring provided to the path to which a standard net regulated to connect the pins 12 and 13 is applied, whereas numeral 35 denotes another standard wiring provided to the path to which the standard net regulated to connect the pins 14 and 15 is applied. Since other elements are same as or similar to those having the same numerals shown in FIG. 3, the detailed explanation thereabout is omitted here.

Thereafter, on the basis of the result of the detail routing, the connecting relations between variable nets and cells are regulated to the net list by the variable net connecting means 32 in step ST35. When regulating the connecting relations between variable nets and cells, a weighted evaluating function is used just like the case of the first embodiment.

Figure 12:
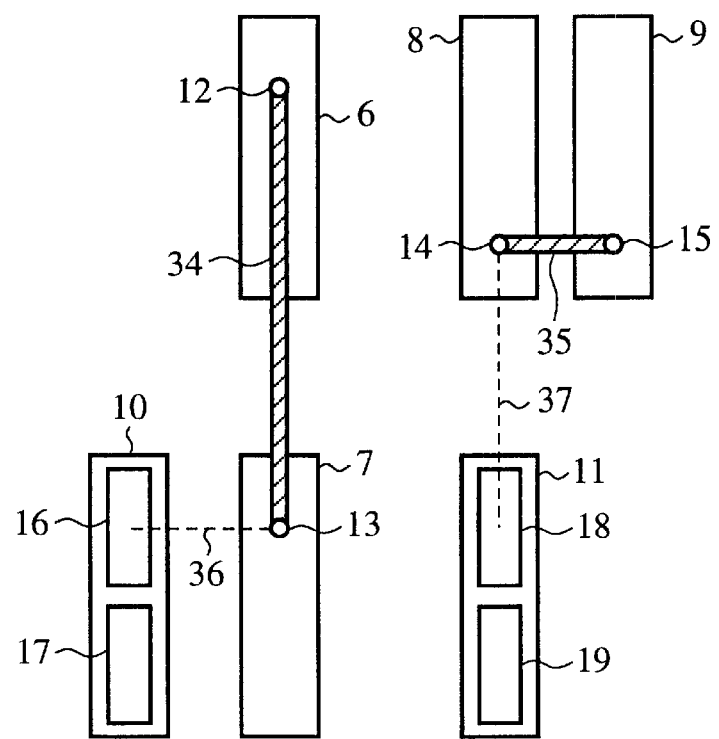
FIG. 12 is a layout showing the state immediately after the step ST35 of FIG. 10.

FIG. 12 is a layout showing the state immediately after the completion of the step ST35 of FIG. 10. FIG. 12 shows the case in which the connecting relations of the variable nets are regulated such that the particular wiring is made short. In the figure, in order to specify that the pins 13 and 16 are regulated to be connected to each other by a variable net, the connecting relation thereof is indicated by numeral 36, whereas in order to specify that the pins 14 and 18 are regulated to be connected to each other by a variable net, the connecting relation thereof is indicated by numeral 37. In this case, the standard net which had been regulated to connect the pins 12 and 13 is further regulated to be connected to the pin 16 by way of a variable net, whereas the standard net which had been regulated to connect the pins 14 and 15 is further regulated to be connected to the pin 18 by way of a variable net. Since other elements are same as or similar to those having the same numerals shown in FIG. 11, the precise explanation thereabout is omitted there.

Thereafter, the wired state after the detail routing is amended by the ECO wiring means 33 in accordance with the connecting relations of the variable nets in step ST36.

After this step, a mask is formed on the basis of the result of the above-explained automatic placement and routing, and a semiconductor integrated circuit is formed by use of the thus formed mask.

As explained heretofore, according to the third embodiment of the present invention, since the connecting relations of the standard nets are regulated before the placement of cells, and after the placement of cells, a global routing and a detail routing are executed with respect to the located cells and the connecting relations of the variable nets are regulated on the basis of the result of the detail routing, so that such effects as those obtained by the first embodiment can be obtained.

Fourth Embodiment

Figure 13:
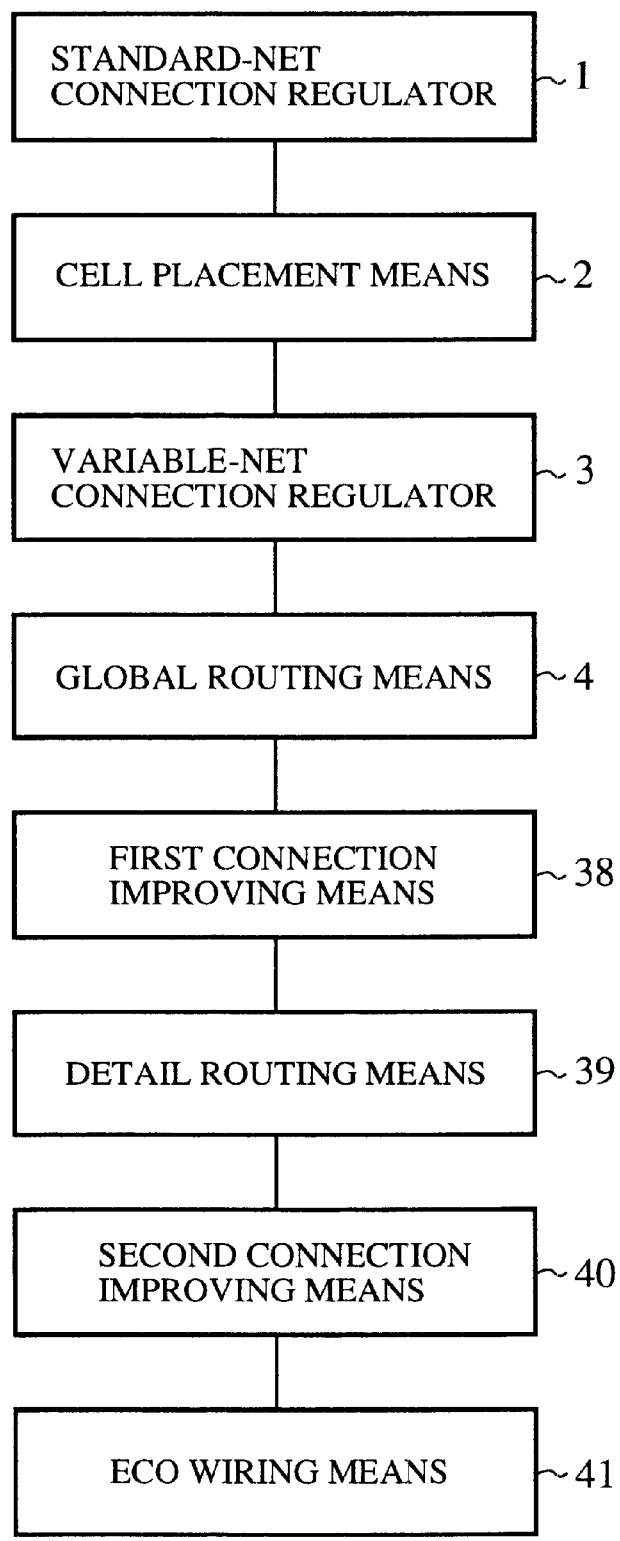
FIG. 13 is a block diagram showing the automatic placement and routing device according to a fourth embodiment of the present invention.

FIG. 13 is a block diagram showing an automatic placement and routing device according to a fourth embodiment of the present invention. In the figure, numeral 38 denotes a first connection improving means, which improves the connecting relations of the variable nets on the basis of the result of the global routing conducted in accordance with the connecting relations of the standard nets and those of the variable nets, and also carries but a global routing with respect to the cells whose placement has already been completed, in accordance with the thus improved connecting relations of the variable nets, numeral 39 denotes a detail routing means, which carries out a detail routing with respect to the cells already located on the basis of the result of the global routing conducted in accordance with the connecting relations of the standard nets and the improved connecting relations of the variable nets, numeral 40 denotes a second connection improving means for improving the connecting relations of the variable nets on the basis of the result of the detail routing, and numeral 41 denotes an ECO wiring means for amending the wiring of the cells with respect to which a detail routing has already been executed, in accordance with the connecting relations of the variable nets after the second improvement of the connecting relations thereof. Since other elements are same as or similar to those having the same numerals shown in FIG. 1, the precise explanation thereabout is omitted here.

The operation of the automatic placement and routing device according to this embodiment is now explained as below.

Figure 14:
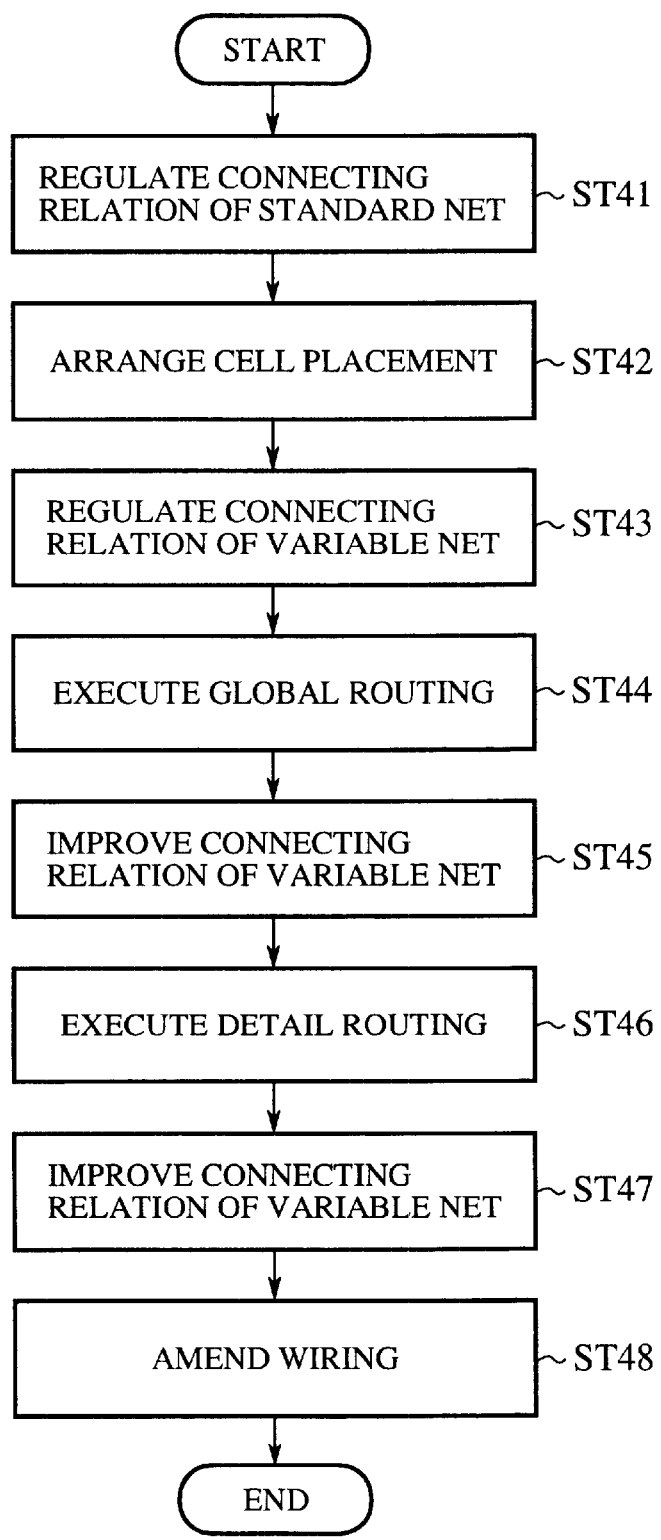
FIG. 14 is a flowchart showing a method of automatic placement and routing according to the fourth embodiment of the present invention.

FIG. 14 is a flowchart showing a method of automatic placement and routing according to the fourth embodiment of the present invention.

First, just like the first embodiment, the connecting relations between standard nets and cells are regulated into the net list by the standard connection regulator 1 in step ST41. Thereafter, the placement of cells is executed on the basis of the connecting relations of the standard nets by the cell placement means 2 in step ST42. Note that the layout showing the state immediately after the step ST42 is same as that of FIG. 3.

Thereafter, just like the case of the first embodiment, the connecting relations between variable nets and cells are regulated to the net list by the variable-net connection regulator 3 on the basis of the result of the placement of the cells, and after that, a global routing is carried out with respect to the cells already located in accordance with the connecting relations of the standard nets and those of the variable nets in step ST44.

Figure 15:
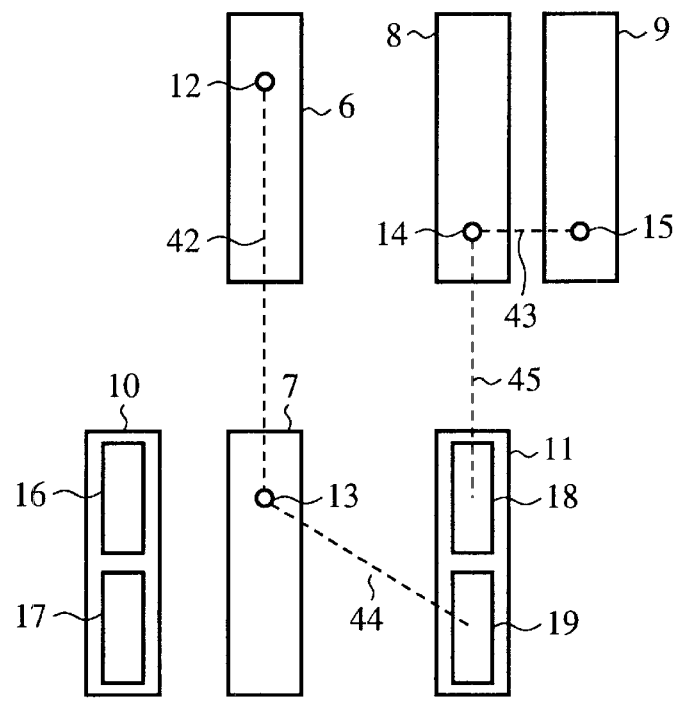
FIG. 15 is a layout showing the state immediately after the step ST44 of FIG. 14.

FIG. 15 is a layout showing the state immediately after the completion of step ST44 of FIG. 14. In the figure, the path to which the standard net regulated to connect the pins 12 and 13 is applied is denoted by a broken line 42, whereas the path to which the standard net regulated to connect the pins 14 and 15 is applied is denoted by a broken line 43. In the same manner, the path to which the variable net regulated to connect the pins 13 and 19 is applied is denoted by a broken line 44, whereas the path to which the variable net regulated to connect the pins 14 and 18 is applied is denoted by a broken line 45. In this case, the standard net which shad been regulated to connect the pins 12 and 13 is further regulated to be connected to the pin 19 by way of a variable net, whereas the standard net which had been regulated to connect the pins 14 and 15 is further regulated to be connected to the pin 18 by way of a variable net. The fact that the pins 13 and 19 are regulated to be connected to each other but the pins 13 and 16 are not is due to the influence of surrounding environment. Since other elements are same as or similar to those having the same numerals shown in FIG. 3 , the precise explanation thereabout is omitted here.

Thereafter, the connecting relations of the variable nets are improved on the basis of the result of the global routing conducted in accordance with the connecting relations of the standard nets and those of the variable nets in step ST45.

Figure 16:
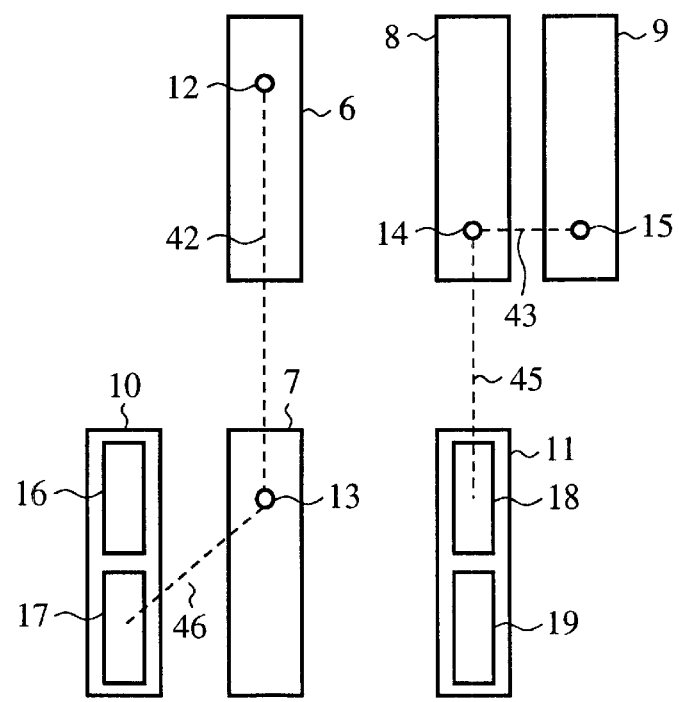
FIG. 16 is a layout showing the state immediately after the step ST45 of FIG. 14.

FIG. 16 is a layout showing the state immediately after the completion of the step ST45 of FIG. 14. In the figure, the path to which the variable net whose connection has been improved from the connection between the pins 13 and 19 to the connection of pins 13 and 17 is applied is denoted by a broken line 46. In this case, the standard net that had been regulated to connect the pins 12 and 13 is improved to further connect to the pin 17 by way of a variable net. The fact that the variable net is improved to connect the pins 13 and 17 but not improved to connect the pins 13 and 16 is due to the influence of surrounding environment. Since other elements are same as or similar to those having the same numerals shown in FIG. 15, the detailed explanation thereabout is omitted here.

After this process, a detail routing with respect to the cells whose placement has already been completed is carried out in step ST46 on the basis of the result of the global routing conducted in accordance with the connecting relations of the standard nets and those of the improved variable nets by the detail routing means 39.

Figure 17:
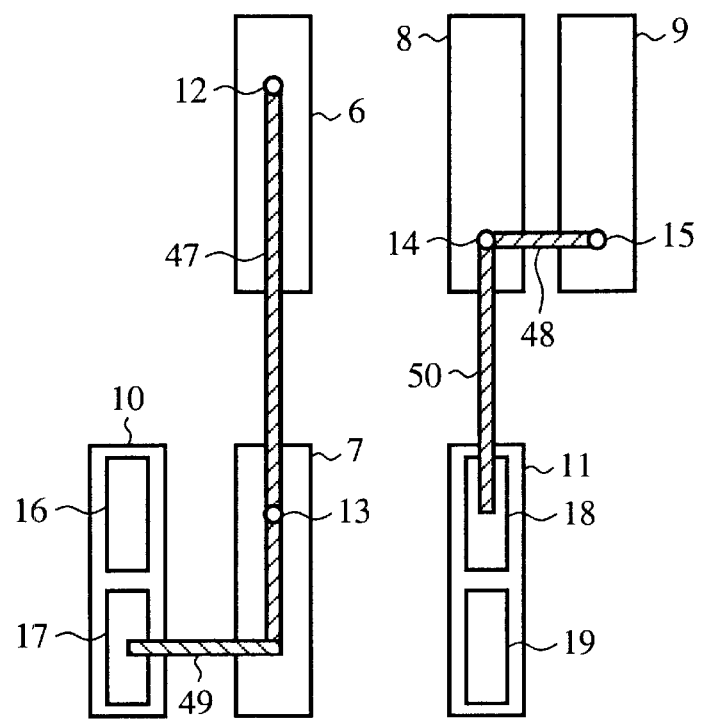
FIG. 17 is a layout showing the state immediately after the step ST46 of FIG. 14.

FIG. 17 is a layout showing the state immediately after the completion of step ST46 of FIG. 14. In the figure, reference numeral 47 denotes a standard wiring provided to the path to which the standard net that had been regulated to connect the pins 12 and 13 is applied, numeral 48 denotes another standard wiring provided to the path to which the standard net that had been regulated to connect the pins 14 and 15 is applied, numeral 49 denotes a particular wiring provided to the path to which the variable net that has been improved to connect the pins 13 and 17 is applied, and numeral 50 denotes a particular wiring provided to the path to which the variable net that has been regulated to connect the pins 14 and 18 is applied. Since other elements are same as or similar to those having the same numerals shown in FIG. 15, the detailed explanation thereabout is omitted here.

After this process, the connecting relations of the variable nets are improved on the basis of the result of the detail routing conducted by the second connection improving means instep ST47. When improving the connecting relations of the variable nets, a weighted evaluating function as explained in the first embodiment is used.

Figure 18:
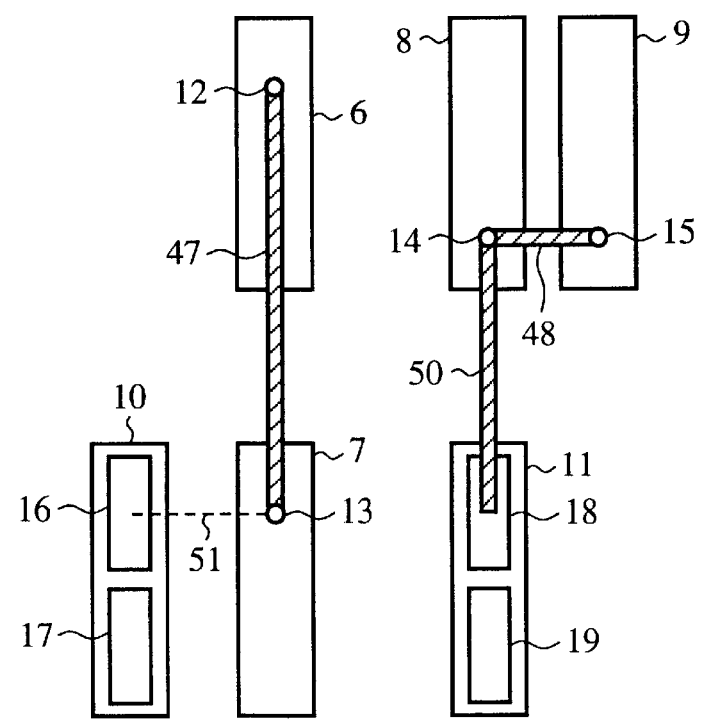
FIG. 18 is a layout showing the state immediately after the step ST47 of FIG. 14.

FIG. 18 is a layout showing the state immediately after the completion of step ST47 of FIG. 14. In the figure, in order to indicate that the variable net that had been improved to connect the pins 13 and 17 has been further improved to connect the pins 13 and 16, the connecting relation is denoted by numeral 51. In this case, the standard net that had been regulated to connect the pins 12 and 13 is improved to further connect to the pin 16 by way of a variable net. Since other elements are same as or similar to those having the same numerals shown in FIG. 17, the detailed explanation thereabout is omitted here.

Thereafter, the wired state with respect to the cells after the detail routing is amended by the ECO wiring means in accordance with the twice-improved connecting relations of the variable nets in step ST48. Before or after the step ST48, the particular wiring 49 provided to the path to which the variable net that had been improved to connect the pins 13 and 17 is deleted.

After this step, a mask is formed on the basis of the result of the above-mentioned automatic placement and routing, and a semiconductor integrated circuit is formed by use of the thus formed mask.

As explained heretofore, according to the fourth embodiment of the present invention, the connecting relations between standard nets and cells are regulated before the placement of cells, and after the placement of cells, the connecting relations between variable nets and cells are also regulated on the basis of the result of the placement of cells. Further, the connecting relations between variable nets and cells are improved after the execution of a global routing and also that of the detail routing with respect to the cells already located. By this process, such effects as those obtained by the first embodiment can be obtained.

Note that the same effects can be obtained even by executing the steps ST21 to ST25 of the second embodiment, and thereafter by executing the steps ST47 and ST48.

Fifth Embodiment

Figure 19:
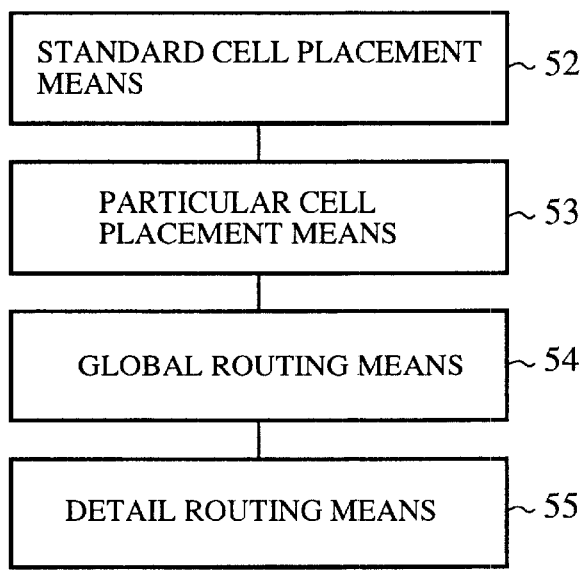
FIG. 19 is a block diagram showing the automatic placement and routing device according to a fifth embodiment of the present invention.

FIG. 19 is a block diagram showing an automatic placement and routing device according to a fifth embodiment of the present invention. In the figure, numeral 52 denotes a standard cell placement means for arranging the placement of standard cells on the basis of the connecting relations of the standard nets, numeral 53 denotes a particular cell placement means for arranging the placement of particular cells outside the range in which the standard cells are disposed, numeral 54 denotes a global routing means for executing a global routing with respect to the standard and particular cells whose placement has already been completed, in accordance with the connecting relations regulated in the net list, and numeral 55 denotes a detail routing means for carrying out a detail routing with respect to the standard and particular cells already located on the basis of the result of the global routing.

The operation of the automatic placement and routing device according to this embodiment is now explained as below.

Figure 20:
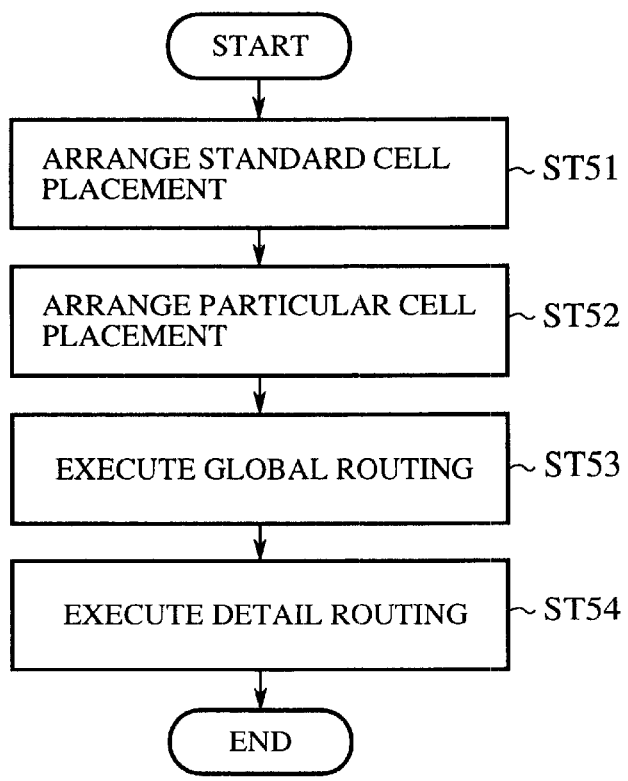
FIG. 20 is a flowchart showing a method of automatic placement and routing according to the fifth embodiment of the present invention.

FIG. 20 is a flowchart showing a method of automatic placement and routing according to the fifth embodiment of the present invention.

Figure 21:
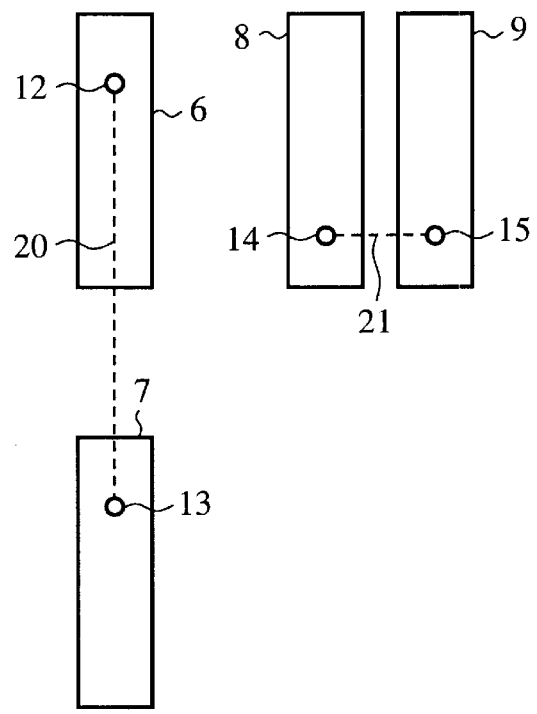
FIG. 21 is a layout showing the state immediately after the step ST51 of FIG. 20.

First of all, the standard cells are located on the basis of the connecting relation of the standard nets by the standard cell placement means 52 in step ST51. FIG. 21 is a layout showing the state immediately after the completion of step ST51 of FIG. 20.

Figure 22:
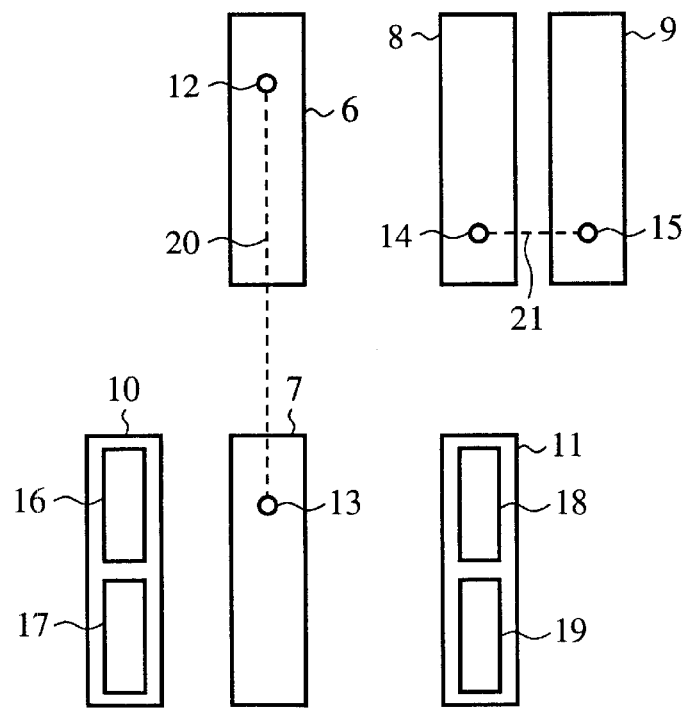
FIG. 22 is a layout showing the state immediately after the step ST52 of FIG. 20.

Thereafter, particular cells are located outside the range in which the standard cells are disposed by the particular cell placement means 53 in step ST52. FIG. 22 is a layout showing the state immediately after the completion of step ST52 of FIG. 20.

After this process, a global routing is executed with respect to the particular cells and standard cells after the placement thereof in accordance with the connecting relations regulated in the net list by the global routing means 54 in step ST53.

Thereafter, a detail routing is carried out with respect to the standard and particular cells whose placement has already been completed, on the basis of the result of the global routing by the detail routing means 55 in step ST54.

Note that the connecting relations of the variable nets can be regulated either preliminary, after the placement of the particular cell, after the global routing is completed, or even after the detail routing is completed.

In the case where the connecting relations of the variable nets are regulated preliminarily, the process in step ST52 is performed on the basis of the connecting relation of the variable, nets. In the case where it is regulated after the placement of the particular cells, the processes in the steps after the step ST53 are performed just like the first embodiment. In the case where it is regulated after the global routing is completed, the processes in the steps after the step ST53 are performed just like the second embodiment. In the case where it is regulated after the detail routing is completed, the processes in the steps after the step ST53 are performed just like the third embodiment.

After either one of these steps, a mask is formed on the basis of the result of the above-mentioned automatic placement and routing, and a semiconductor integrated circuit is formed by use of the thus formed mask.

As explained above, according to the fifth embodiment of the present invention, since the particular cells are disposed outside the range in which the standard cells are disposed, all after the standard cells have already been located, the particular cells can be disposed in such a manner as to make the particular wiring short, and also to make the complexity of wirings thereof small, so that such effecs as making the particular wiring short, and making the complexity of wirings thereof small and so on can be obtained.

Further, since the standard cells can be disposed such that the standard wiring is not affected by the particular wiring, a semiconductor IC circuit. of high speed, low power consumption and of high reliability can be obtained.

Sixth Embodiment

Figure 23:
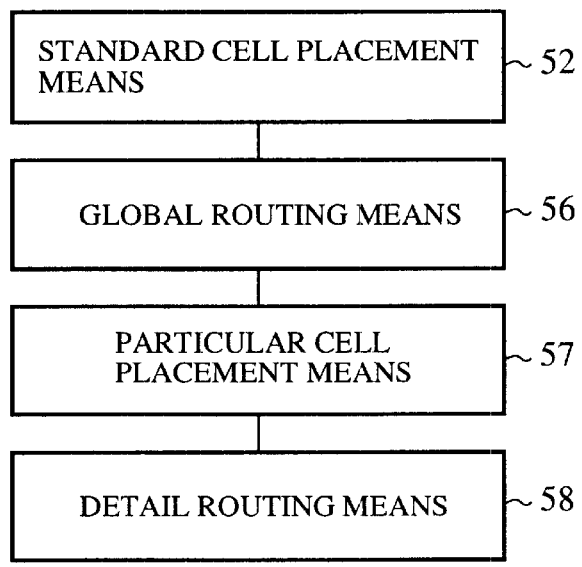
FIG. 23 is a block diagram showing the automatic placement and routing device according to a sixth embodiment of the present invention.

FIG. 23 is a block diagram showing an automatic placement and routing device according to a sixth embodiment of the present invention. In the figure, numeral 56 denotes a global rousting means for carrying out a global routing with respect to the standard cells whose placement has already been completed, in accordance with the standard connecting relations of the standard nets regulated in the net list, numeral 57 denotes a particular cell placement means for locating the particular cells outside the range in which the standard cells are disposed on the basis of the result of the global routing, numeral 58 denotes a detail routing means for carrying out a detail routing with respect to the standard and particular cells already located on the basis of the result of the global routing. Since other elements are same as or similar to those having the same numerals shown in FIG. 19, the precise explanation thereabout is omitted here.

Figure 24:
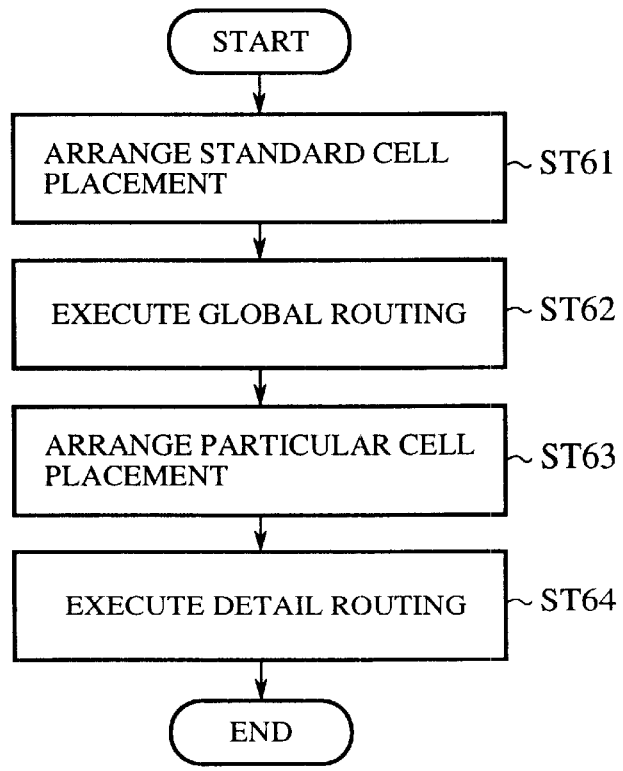
FIG. 24 is a flowchart showing a method of automatic placement and routing according to the sixth embodiment of the present invention.
Figure 25:
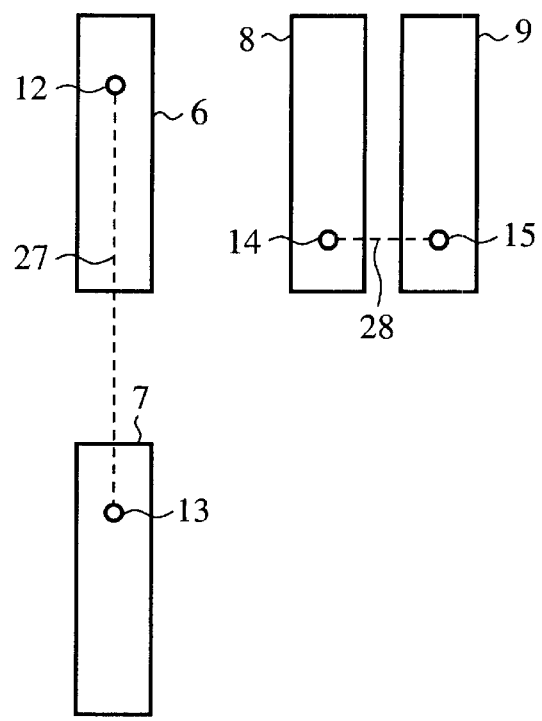
FIG. 25 is a layout showing the state immediately after the step ST62 of FIG. 24.

The operation of the automatic placement and routing device according to this embodiment is now explained as below FIG. 24 is a flowchart showing a method of automatic placement and routing. First of all, the standard cells are located on the basis of the connecting relations of the standard nets by the standard cell placement means 52 in step ST61 just as the case of the fifth embodiment. The layout state of immediately after the completion of step ST61 of FIG. 24 is same as that of FIG. 21.

Thereafter, a global routing is executed in step ST62 with respect to the standard cells already located by the global routing means 56 in accordance with the connecting states of the standard nets regulated in the net list.

Figure 26:
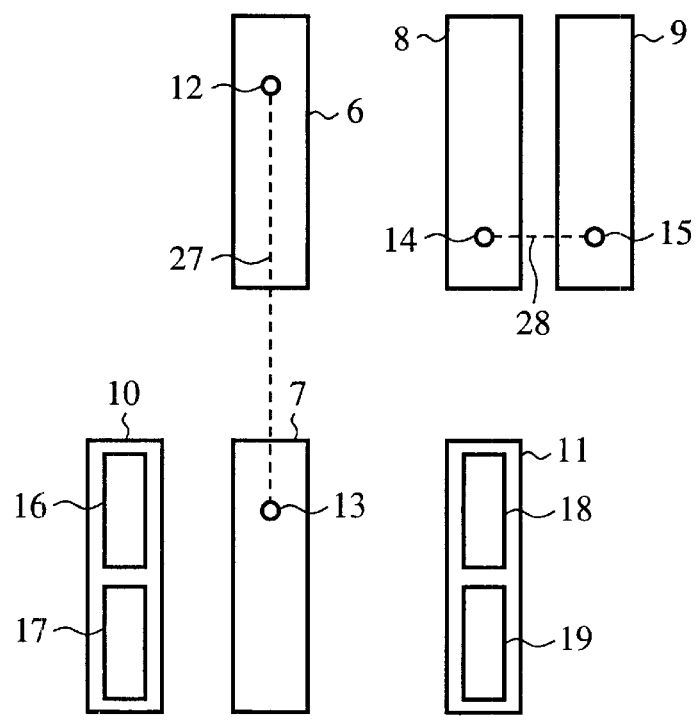
FIG. 26 is a layout showing the state immediately after the step ST63 of FIG. 24.
Figure 27:
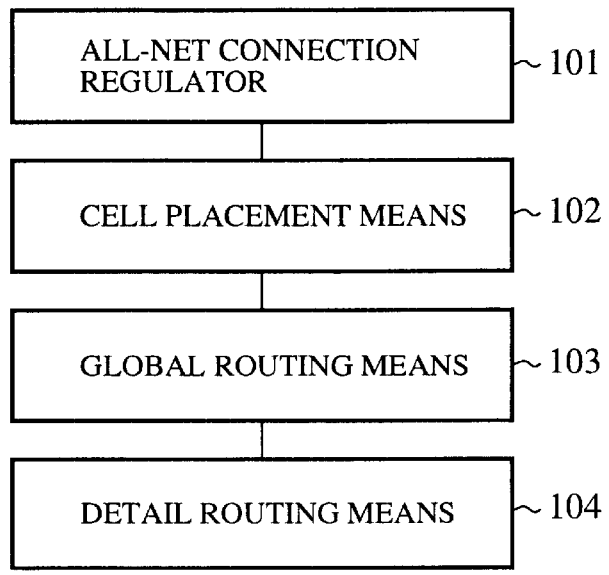
FIG. 27 is a block diagram showing a conventional automatic placement and routing device.
Figure 28:
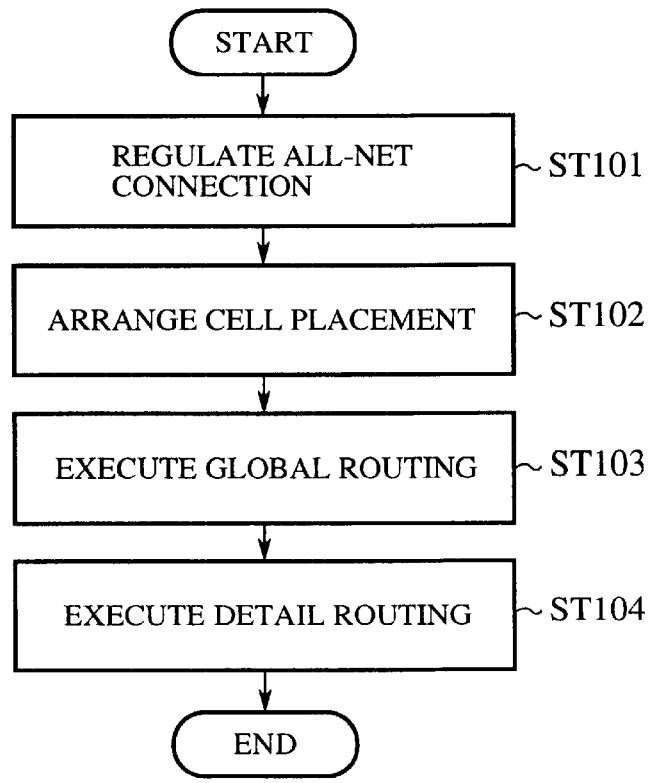
FIG. 28 is a flowchart showing a conventional method of automatic placement and routing.
Figure 29:
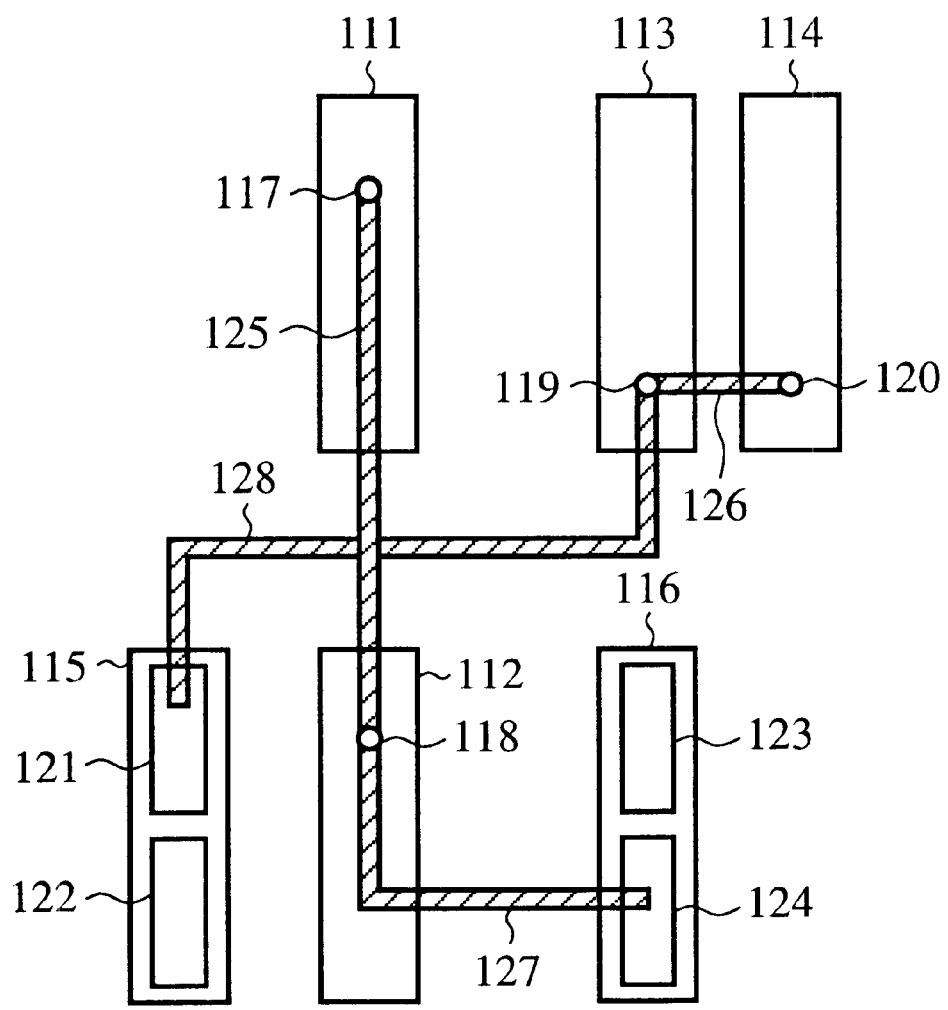
FIG. 29 is a layout showing the state immediately after the step ST104 of FIG. 28.

Thereafter, particular cells are disposed outside the range in which the standard cells are disposed by the particular cell placement means 57 in step ST63. FIG. 26 is a layout showing the state immediately after the completion of step ST63 of FIG. 24.

After this process, a detail routing is executed with respect to the particular cells and standard cells after the placement thereof is already completed, on the basis of the result of the global routing, by the detail routing means 58 in step ST64.

Note that the connecting relations of the variable nets can be regulated either preliminarily, after the global routing is completed, after the placement of particular cells, or even after the detail routing is completed.

In the case where the connecting relations of the variable nets are regulated preliminarily, the process in step ST63 is performed on the basis of the connecting relations of the variable nets.

In the case where it is regulated after the global routing, the process in step ST63 is performed on the basis of the connecting relations of the variable nets, and after the step ST63,) a global routing is executed with respect to the standard and particular cells whose placement has already been completed, in accordance with the connecting relations of the variable nets. Then, the process in step ST64 is executed on the basis of the result of the global routing in accordance with the connecting relations of the standard nets and those of the variable nets.

In the case where it is regulated after the placement of particular cells, a global routing is executed with respect to the standard cells and the particular cells after the step ST63 in accordance with the connecting relations of the variable nets, and then the process in the step ST64 is executed on the basis of the result of the global routing conducted in accordance with the connecting relations of the standard nets and those of the variable nets.

In the case where it is regulated after the detail routing, the processes in the steps after the step ST64 are performed just like the third embodiment.

After either one of these steps, a mask is formed on the basis of the result of the above-explained automatic placement and routing, and a semiconductor integrated circuit is formed by use of the thus formed mask.

As explained above, according to the sixth embodiment of the present invention, a global routing is executed with respect to the standard cells already located, and the particular cells are located outside the range in which the standard cells particular cells are disposed on the basis of the result of this global routing, so that those effects obtained by the fifth embodiment can be obtained.

Note that the net to be connected to a monitor pad can be connected to any one of a plurality of pads, so that it is not important to determine to which pad the net is to be connected. Thus, in the case where a semiconductor IC is provided with test-use pads, the automatic placement and routing device of any one of those embodiments can be employed.

As a conclusion, since the automatic placement and routing device according to the present invention is provided with a standard-net connection regulator for regulating the connecting relations between standard nets and cells into a net list, a cell placement means for arranging the placement of cells on the basis of the connecting relations of the standard nets, and a variable-net connection regulator for regulating the connecting relations between variable nets and cells after the completion of the cell placement arrangement, it can be used for forming a semiconductor IC, in which the particular wiring is made short and the complexity of wiring is made small, and also the particular wiring does not cause any adverse effect to the standard wiring.

Further, since the automatic placement and routing device according to the present invention is provided with a standard cell placement means for arranging the placement of standard cells on the basis of the connecting relations of the standard nets, and a particular cell placement means for arranging the placement of the particular cells outside the range in which the standard cells are disposed, it can be used for forming a semiconductor IC, in which the particular wiring is made short and the complexity of wiring is made small, and also the particular wiring does not cause any adverse effect to the standard wiring.

Still further, since the method of automatic placement and routing according to the present invention comprises a standard-net connection regulating step for regulating the connecting relations between standard nets and cells into a net list, a cell placement step for arranging the placement of cells on the basis of the connecting relations of the standard nets, and also a variable net connection regulating step for regulating the connecting relations between the variable nets and cells into a net list, it can be used for forming a semiconductor IC, in which the particular wiring is made short and the complexity of wiring is made small, and also the particular wiring does not cause any adverse effect to the standard wiring.

Yet still further, since the method of automatic placement and routing according to the present invention comprises a standard cell placement step for arranging the placement of standard cells on the basis of the connecting relations of the standard nets, and a particular cell placement step for arranging the placement of the particular cells outside the range in which the standard cells are disposed, it can be used for forming a semiconductor IC, in which the particular wiring is made short and the complexity of wiring is made small, and also the particular wiring does not cause any adverse effect to the standard wiring.

What is claimed is:

1. An automatic placement and routing device for forming an integrated circuit by arranging the placement of a plurality of cells and wiring these cells by use of a plurality of nets, wherein the nets are grouped into two types; namely variable nets whose connecting relations with the cells do not need to be regulated in advance and standard nets other than the variable nets, said automatic placement and routing device comprising:

a standard-net connection regulating means for regulating the connecting relations between the standard nets and the cells into a net list, a cell placement means for arranging the placement of cells on the basis of the connecting relations of the standard nets, a variable-net connection regulating means for regulating into a net list the connecting relations between the variable nets and the cells whose placement has already been completed, a global routing means for executing a global routing with respect to the cells after the completion of the placement thereof, in accordance with the connecting relations of the standard nets, and a detail routing means for executing a detail routing with respect to the cells already located, on the basis of the global routing conducted in accordance with the connecting relations of the standard nets, wherein said variable-net connection regulating means regulates the connecting relations between the variable nets and the cells on the basis of the result of the detail routing.

2. The automatic placement and routing device according to claim 1, wherein said variable-net connection regulating means regulates the connecting relations between the variable nets and cells on the basis of the result of the cell placement conducted by said cell placement means.

3. The automatic placement and routing device according to claim 2 further comprising a connection improving means for improving the connecting relations of the variable nets on the basis of the result of the global routing conducted in accordance with the connecting relations of the standard nets and those of the variable nets.

4. The automatic placement and routing device according to claim 2 further comprising a connection improving means for improving the connecting relations of the variable nets on the basis of the result of the detail routing.

5. The automatic placement and routing device according to claim 1 further comprising a connection improving means for improving the connecting relations of the variable nets on the basis of the result of the detail routing.

6. An automatic placement and routing device for forming an integrated circuit by arranging the placement of a plurality of cells and wiring these cells by use of a plurality of nets, wherein the nets are grouped into two types; namely variable nets whose connecting relations with the cells do not need to be regulated in advance and standard nets other than the variable nets, said automatic placement and routing device comprising:

a standard-cell placement means for arranging the placement of the standard cells regulated to be connected to the standard nets, on the basis of the connecting relations of the standard nets, a particular cell placement means for arranging the placement of the particular cells regulated to be connected only to the variable nets outside the area in which the standard cells are disposed, and a global routing means for executing a global routing with respect to the cells whose placement has already been completed, in accordance with the connecting relations of the standard nets, and said particular cell placement means disposes the particular cells on the basis of the result of the global routing.

* * * * *